United States Patent

Fujii

[11] Patent Number: 5,822,348
[45] Date of Patent: Oct. 13, 1998

[54] SEMICONDUCTOR LASER

[75] Inventor: Hiroaki Fujii, Tokyo, Japan

[73] Assignee: NEC Corporation, Tokyo, Japan

[21] Appl. No.: 772,769

[22] Filed: Dec. 24, 1996

[30] Foreign Application Priority Data

Jan. 26, 1996 [JP] Japan ................................. 8-011803

[51] Int. Cl.⁶ .................................................. H01S 3/19
[52] U.S. Cl. ................................................ 372/45; 372/46
[58] Field of Search .......................................... 372/45, 46

[56] References Cited

U.S. PATENT DOCUMENTS

| | | | |
|---|---|---|---|
| 5,361,271 | 11/1994 | Takiguchi et al. | 372/46 |
| 5,446,753 | 8/1995 | Yoshida | 372/46 |

FOREIGN PATENT DOCUMENTS 3-185889   8/1991   Japan ....................................... 372/46

Primary Examiner—Rodney B. Bovernick
Assistant Examiner—Quyen Phan Leung
Attorney, Agent, or Firm—Sughrue, Mion, Zinn, Macpeak & Seas, PLLC

[57] ABSTRACT

The object of the present invention is to realize a transparent waveguide path AlGaInP laser which is capable of a low threshold current and a high light output efficiency without deterioration in characteristic due to crystal distortion. The semiconductor laser comprises an active layer formed on a GaAs substrate, upper and lower clad layers containing the active layer therebetween a current block layer which transmits oscillation light and has a stripe-shaped opening is formed on the upper clad layer, an etching stopper layer formed between the upper clad layer and the current block layer and on the upper clad layer exposed in a stripe shape by the opening section of the current block layer, the etching stopper layer containing no aluminium; and a clad layer formed on the current block layer and on the etching stopper layer exposed in a stripe shape by the opening section of the current block layer, wherein the upper clad layer is formed of a semiconductor containing AlGaInP or AlInP.

4 Claims, 5 Drawing Sheets

SEMICONDUCTOR LASER

BACKGROUND OF THE INVENTION

1. Field of the Invention

The present invention relates to a semiconductor laser formed of an AlGaInP compound, which produces wavelengths in a range corresponding from red to orange and is used for such as digital video disks and magneto-optical disks.

2. Description of the Related Art

In recent years, AlGaInP short wavelength lasers and AlGaInP high power lasers have been developed on an extensive scale for use in digital video disks and magneto-optical disks. An example of the high power lasers is recited in Electronics Letters, vol. 28, page 860, 1992, UENO et al.

However, most of the conventional AlGaInP red color semiconductor lasers employ a ridge structure having a GaAs current block layer, which absorbs laser light, as shown in FIG. 1. Referring to FIG. 1, reference numeral 301 denotes an MQW (Multi Quantum Well) active layer; 302, an n-AlGaInP clad layer; 303, a p-AlGaInP clad layer; 304, a p-GaInP cap layer; 306, an n-GaAs buffer layer; 308, an n-GaAs block layer; 309, a p-GaAs contact layer; 310, an n-GaAs substrate; 311, an n-side electrode; and 312, a p-side electrode.

With employment of the ridge structure as described above, in the AlGaInP red color semiconductor laser, internal loss related to a wave-guide of laser light is large. An increase in threshold current and operating current, and a decrease in slope efficiency are brought about. From such circumference, it is difficult to obtain desirable characteristics.

On the other hand, as shown in FIG. 2, a semiconductor laser of the ridge structure using AlInP transparent for oscillation light as the block layer has been reported by Ryuji KOBAYASHI et al. at a International Semiconductor Laser Diode Conference in 1994 (disclosed in page 243 of the proceedings). Referring to FIG. 2, reference numeral 401 denotes an MQW active layer; 402, an n-type AlGaInP clad layer; 403, a p-AlGaInP clad layer; 404, a p-GaInP cap layer; 406, an n-GaAs buffer layer; 407, an AlInP block layer; 408, an n-GaAs block layer; 409, a p-GaAs contact layer; 410, an-GaAs substrate; 411, an n side electrode; and 412, a p side electrode.

In the above-described structure, the AlInP block layer 407 formed on the bottom and side of the ridge functions as a current block layer. The block layer 407 functions also as a light confining layer in a horizontal direction by means of an effective refraction index waveguide utilizing a refraction index difference between the layer 407 and the n-GaAs block layer 408 formed thereon. It has been confirmed that, in the semiconductor laser shown in FIG. 2, the internal loss is small because AlInP transmits oscillating light, reduces threshold current, and increases light output efficiency.

However, the foregoing semiconductor laser has the following problems. The AlInP block layer is grown by means of a metal-organic vapor phase epitaxy method (MOVPE method) so as to be buried. In the AlInP block layer formed in the above-described manner, a lattice constant of a flat portion differs greatly from that of a slope portion of the ridge side surface. Thus, crystal distortion is caused so that characteristic and reliability of elements are adversely affected.

This is because segregation of material is caused due to the difference between diffusion coefficients of III group materials (Al and In) on the crystal plane and the difference between sticking coefficients in crystals when more than one kind of crystal plane is present on the surface in the MOVPE growth. Therefore, it is considered that the foregoing laser structure is not suitable for use when strict operation characteristics are required such as a high temperature operation characteristic of short wavelength lasers and high temperature and high output characteristics of high output lasers.

On the other hand, a self aligned structure (SAS), shown in FIG. 3, is well known a laser structure in AlGaAs infrared semiconductor lasers.

Referring to FIG. 3, reference numeral 501 denotes an $Al_{0.15}Ga_{0.84}As$ active layer; 502, an $n-Al_{0.5}Ga_{0.5}As$ clad layer; 503, a first $p-Al_{0.5}Ga_{0.5}As$ light guide layer; 504, a second $p-Ga_{0.5}In_{0.5}P$ layer; 505, a $p-Al_{0.5}Ga_{0.5}As$ clad layer; 506, an n-GaAs buffer layer; 507, an $n-Al_{0.6}Ga_{0.4}As$ block layer; 508, an $n-Al_{0.2}Ga_{0.8}As$ protection layer; 509, a p-GaAs contact layer; 510, an n-GaAs substrate; 511, an n-side electrode; and 512, a p-side electrode.

The laser structure shown in FIG. 3 is disclosed in Japanese Patent Application Laid-open No. 132607/1994. This patent application discloses a block layer 507 for-blocking a current constituted of an $n-Al_{0.6}Ga_{0.4}As$ which is transparent for oscillation light. In addition, to form a waveguide path, an opening in the block layer 507 is formed to make it stripe-shaped. The $p-Al_{0.5}Ga_{0.5}As$ clad layer 505 is grown so as to be buried in the opening and to fill the opening. The second light guide layer 504 formed of $p-Ga_{0.5}In_{0.5}P$ is previously formed as an etching stopper layer for the formation of the stripe-shaped opening. Thus, a AlGaAs infrared semiconductor laser having a satisfactory characteristic can be realized.

Among the foregoing conventional examples, since the ridge structure having the GaAs current block layer absorbing oscillation light is employed in the semiconductor laser shown in FIG. 1, this structure suffers an internal loss related to the waveguide of laser light which is large, increases in an oscillation threshold current and an operation current, and decrease in light output efficiency which makes it difficult to obtain a satisfactory characteristic.

In the semiconductor laser shown in FIG. 2, the AlInP block layer is grown by means of the metal-organic vapor phase epitaxy method (MOVPE method) so as to be buried. At this time, the lattice constant of AlInP differs greatly in a flat portion from that of a slope portion of the ridge side surface. Thus, crystal distortion is caused so that characteristic and reliability of elements are adversely affected.

In the semiconductor laser disclosed in Japanese Patent Application Laid-open No. 132607/1994, the foregoing problem is solved because the crystal material is formed basically of an AlGaAs group crystal which is fitted to the GaAs substrate with respect to lattice matching over all the compound regions. Manufacturing of a laser structure similar to the structure disclosed in Japanese Patent Application Laid-open No. 132607/1994 was tried, in which AlGaAs group was replaced with AlGaInP. When the active layer is formed of GaInP, the clad layer of p-AlGaInP and n-AlGaInP, the etching stopper layer of p-GaInP, and the buried clad layer of p-AlGaInP, the lattice constant of the AlGaInP clad layer, which is buried in the opening, in the flat portion differs greatly from that of the slope portion, similar to the ridge structure laser shown in FIG. 2. As a result, deterioration in characteristics due to distortion in the active layer and promotion of a diffusion of impurities was observed.

As described above, it was understood that in the structure disclosed in Japanese Patent Application Laid-open No.

132607/1994, at least in AlGaInP semiconductor lasers, it is difficult to obtain sufficient laser characteristics. The reason for this is considered to be that the lattice constant of the crystal formed of AlGaInP due to change in crystal composition may shift greatly in a value to be in matching with the GaAs substrate. In the MOVPE growth, when more than one kind of crystal plane is present on the surface because of the difference of the diffusion coefficients between group III material (Al, Ga, and In) on the crystal plane and the sticking coefficients into the crystal, the distortion due to the large lattice discrepancy caused by segregation of the material is produced.

SUMMARY OF THE INVENTION

The present invention was made considering the problems involved in the conventional art as described above. The object of the present invention is to provide a transparent waveguide type AlGaInP laser without accompanying deterioration in characteristic due to crystal distortion with little internal loss, in which a low threshold current, and a high light output efficiency.

According to the present invention, there is provided a semiconductor laser, comprising:

an active layer formed on a GaAs substrate, upper and lower clad layers containing said active layer therebetween, a current block layer which is transparent for oscillation light and has a stripe-shaped opening formed on said upper clad layer, an etching stopper layer which does not contain aluminium formed between said upper clad layer and said current block layer and on the upper clad layer exposed in a striped shape by the opening of said current block layer, and a clad layer containing AlGaAs formed on said current block layer and on said etching stopper layer exposed in a stripe shape by the opening of said current block layer, wherein said upper clad layer is formed of a semiconductor containing AlGaInP or AlInP.

Furthermore, the current block layer contains at least layers formed of either GaAs and AlGaInP or GaAs and AlInP, or the etching stopper layer contains GaInP.

In the semiconductor laser constituted as described above, the buried type ridge structure is formed by forming the stripe-shaped opening in the current block layer. The clad layer constituting this buried type ridge structure contains AlGaAs so that large crystal distortion due to the discrepancy of the lattice constant never occurs.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 1:
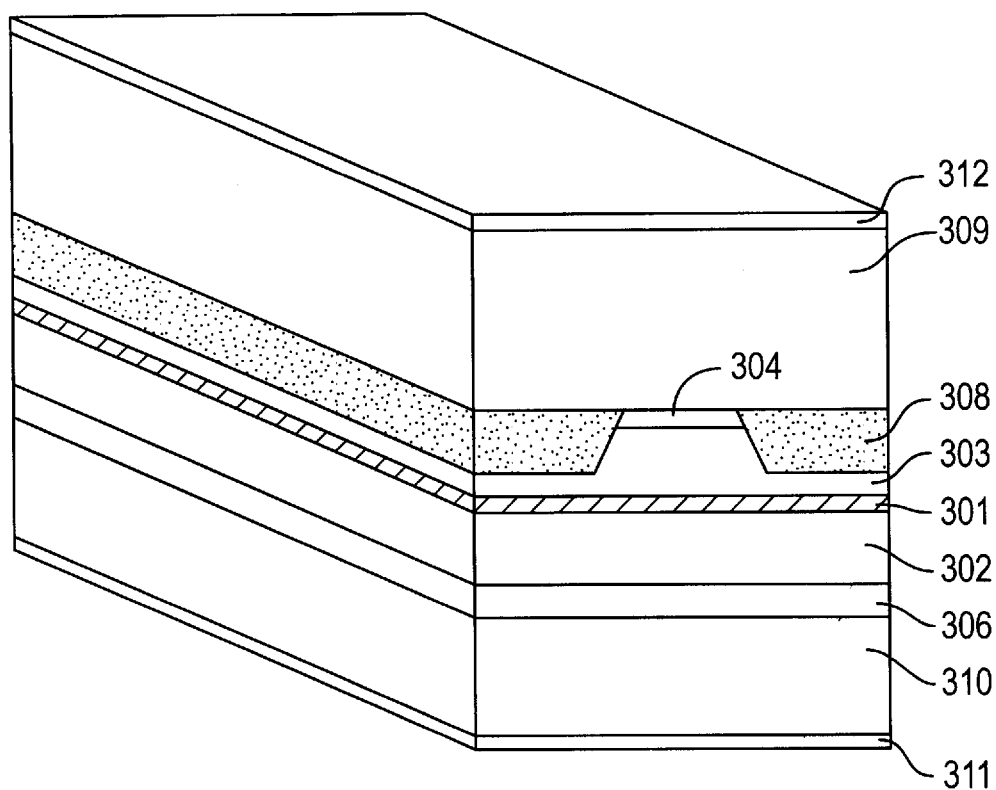
FIG. 1 is a perspective view showing a structure of a conventional semiconductor laser.
Figure 2:
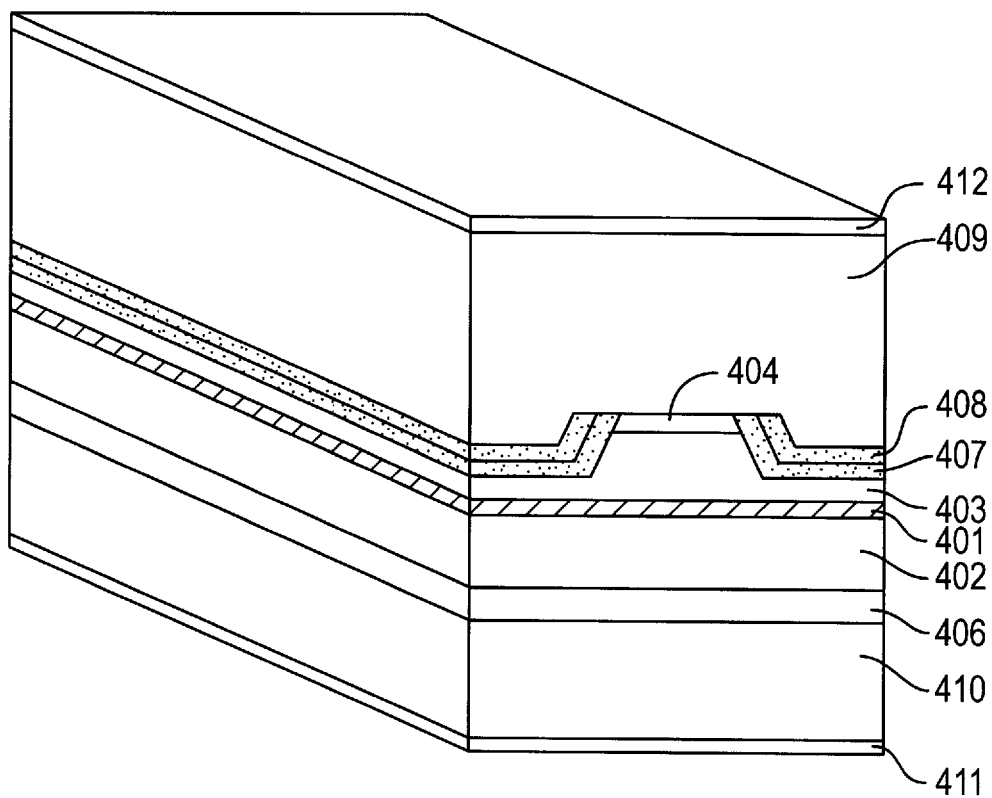
FIG. 2 is a perspective view showing a structure of a conventional semiconductor laser.
Figure 3:
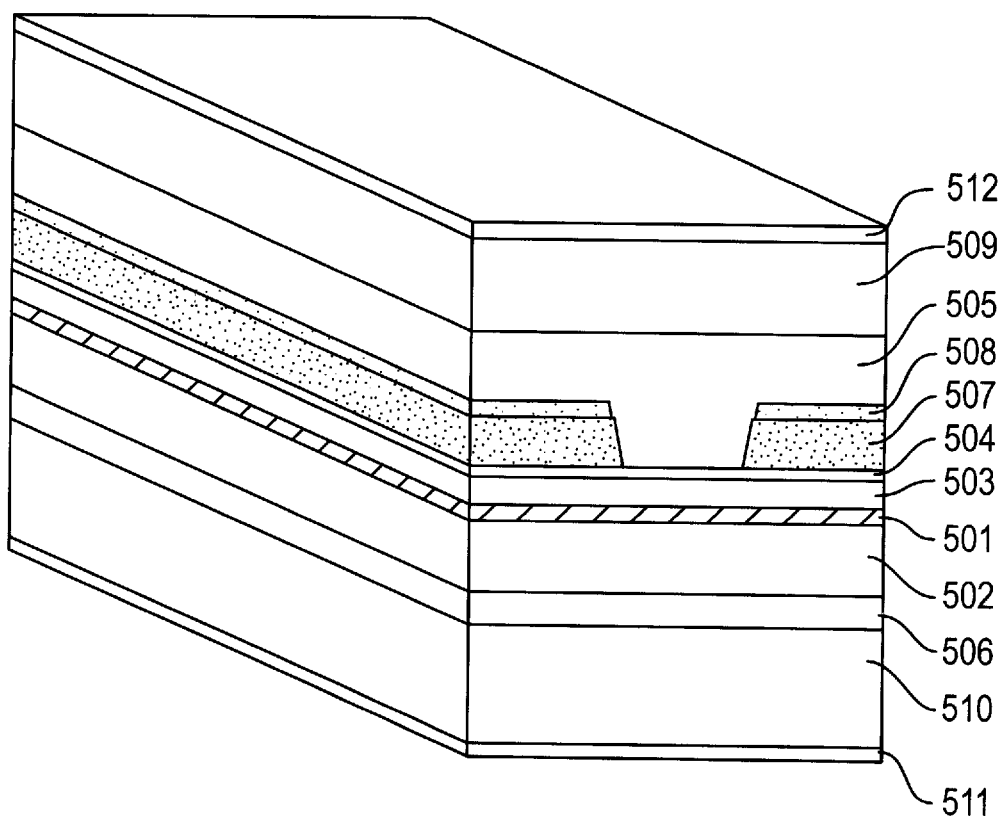
FIG. 3 is a perspective view showing a structure of a conventional semiconductor laser.
Figure 4:
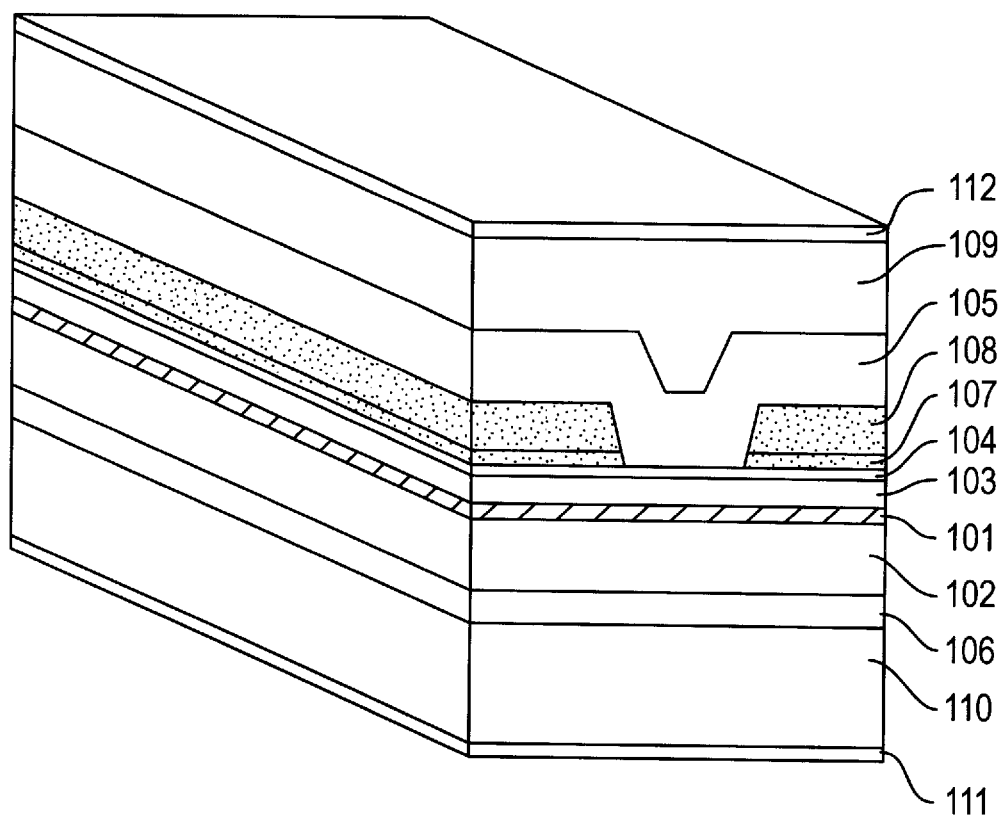
FIG. 4 is a perspective view showing a structure of an embodiment of a semiconductor laser of the present invention.
Figure 5:
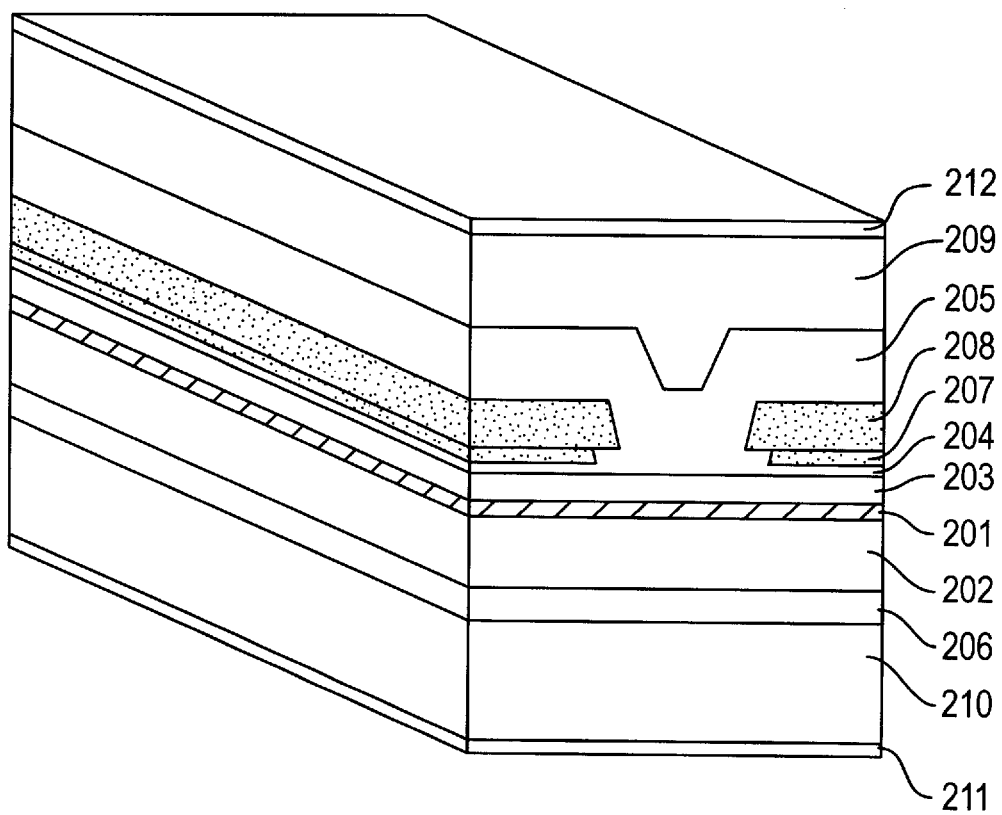
FIG. 5 is a perspective view showing a structure of an embodiment of a semiconductor laser of the present invention.

FIG. 4 is a perspective view showing a structure of a semiconductor laser of the present invention. FIG. 5 is a perspective view showing a structure of a self-pulsation semiconductor laser of the present invention.

First, the semiconductor laser shown in FIG. 4 will be described. Referring to FIG. 4, reference numeral 101 denotes an MQW active layer; 102, an n-AlGaInP clad layer; 103, a p-AlGaInP clad layer; 104, a p-GaInP etching stopper layer; 105, a p-AlGaAs clad layer; 106, an n-GaAs buffer layer; 107, an n-AlGaInP block layer; 108, an n-GaAs block layer; 109, a p-GaAs contact layer; 110, an n-GaAs substrate; 111, an n-side electrode; and 112, a p-side electrode.

The semiconductor laser shown in FIG. 4 employs a double hetero structure as a fundamental vertical waveguide structure, which has a structure arranging the MQW active layer 101 between the p-AlGaInP clad layer 103 and the n-AlGaInP clad layer 102. This semiconductor laser has the following structure to form a horizontal waveguide structure thereon.

First, the block layer 107 including a transparent n-AlGaInP layer for oscillation light is formed as a current block layer. This block layer 107 serves also as a light confining layer to perform a real refractive index waveguide for the oscillating light as well as the current block. Thus, the internal loss concerning the light waveguide decreases, making it possible to decrease the threshold current and increase the light output efficiency.

Subsequently, to make a current injection path, a stripe-shaped opening is formed in the block layer 107. At this time, an etching stopper layer 104 serving as an etching stopper and preventing oxidation during burying growth. The clad layer 105 is formed thereon. As described above, when consideration is made limiting crystal material group to AlGaInP group, a problem of crystal distortion due to lattice discrepancy necessarily occurs. To solve this problem, in the present invention, considering a combination of the AlGaInP group material and the AlGaAs group material, the buried clad layer 105 was made of an AlGaAs layer thereby avoiding a crystal distortion due to great lattice constant discrepancy.

For the AlGaAs group material, even though group III material composition changes at maximum to form AlAs, the lattice constant discrepancy is as small as about 0.3% so that a big problem is not caused. Thus, in the present invention, the block layer 107 transparent for the oscillation light can be provided and an excellent laser structure without crystal distortion can be realized.

Furthermore, in the present invention, since the current block layer is constituted by a two layer structure composed of the block layers 107 and 108, which are formed of AlGaInP and GaAs, respectively, and the block layer 108 serving as a block layer during burying growth does not contain aluminium apt to be oxidized, it is possible to keep excellent crystalinity of the buried layer.

Next, a self-pulsation semiconductor laser of the present invention shown in FIG. 5 will be described. Referring to FIG. 5, reference numeral 201 denotes an MQW active layer; 202, an n-AlGaInP clad layer; 203, a p-AlGaInP clad layer; 204, a p-GaInP etching stopper layer; 205, a p-AlGaAs clad layer; 206, an n-GaAs buffer layer; 207, an n-AlGaInP block layer; 208, an n-GaAs block layer; 209, a p-GaAs contact layer; 210, an n-GaAs substrate; 211, an n-side electrode; and 212, a p-side electrode.

The structure shown in FIG. 5 is an example showing a superiority of the present invention. In recent years, a self-pulsation characteristic has in high demand for semiconductor lasers used for optical disks. Self-pulsation is a self-oscillation phenomenon wherein oscillation light oscillates at several hundred MHz cycles in the structure having supersaturation absorption region inner light waveguide path. There is an advantage that feedback noise is reduced because of phase shifting for feedbacked light from an optical disk when the self-pulsation occurs. In the case of a system where low noise is currently realized by fitting a high frequency module, there is an advantage that the system can be miniaturized because there is no requirement for the high frequency module.

For a general method to realize the self-pulsation, it is well known that an active layer by the side of a light waveguide path functions as a supersaturation absorption layer. This is because a current injection level in the active layer by the side of the light waveguide path is low and its energy band gap is in agreement with that of the oscillation light. Usually, in a ridge type semiconductor laser, this can be realized by increasing the residual thickness of the clad layer by the side of the ridge.

With the structure shown in FIG. 5, it is possible to utilize the supersaturation absorption effect of this active layer more effectively. In addition, it is possible to manufacture it very easily. That is, at the time of the formation of the opening in the current injection section, employment of the etchant capable of etching GaAs and AlGaInP at different etching rate, respectively, enables to provide a structure in which the AlGaInP block layer 207 as shown in FIG. 5 is greatly side-etched.

In the structure described above, since the current injection width defined with the GaAs block layer 208 is small compared with the light waveguide width defined by the AlGaInP block layer, a portion where current is not injected occurs in the active layer. This portion in the active layer where the current is not injected serves as the supersaturation absorption layer. Thus, a self-pulsation AlGaInP laser having an excellent characteristic can be realized.

An embodiment of the semiconductor laser will be described below. First, the embodiment of the semiconductor laser shown in FIG. 4 will be described.

The semiconductor laser of this embodiment was manufactured by an MOVPE method conducted twice and a selective etching. A double hetero structure including an active layer serving as a light emission section is formed in a first MOVPE growth process.

Sequentially, on an n-GaAs substrate are formed an n-GaAs buffer layer 106, of 0.3 $\mu$m thickness, an n-$(Al_{0.7}Ga_{0.3})_{0.5}In_{0.5}P$ clad layer 102 of 1.0 $\mu$m thickness, an MQW active layer 101, a p-$(Al_{0.7}Ga_{0.3})_{0.5}In_{0.5}P$ clad layer 103 of 0.25 $\mu$m thickness, a p-$Ga0.5In0.5P$ etching stopper layer 104 of 5 nm thickness, an n-$(Al_{0.75}Ga_{0.25})_{0.5}In_{0.5}P$ block layer 107 of 0.25 $\mu$m thickness, and an n-GaAs block layer 108 of 0.7 $\mu$m thickness.

Two kinds of the n-GaAs substrates 110 were made by way of experiment, one has a crystal orientation of (001) EXACT and the other has a crystal orientation of (001) 15 deg off to [110]. The former is a laser having an oscillation wavelength near 670 nm, and the latter is a laser having an oscillation wavelength near 650 nm. This difference is caused by a natural super-lattice well known in the AlGaIn P crystal, the natural superlattice being an ordering phenomenon in group III sub-lattice. It has been known that a energy band gap is changed by this. The natural super lattice is strongly formed in the [001] EXACT substrate so that the energy band gap is small. When the [001] EXACT substrate is used, the 670 nm laser is formed. When the 15 degree off substrate is used, the natural superlattice is formed slightly so that the energy band gap is large. Thus, the 650 nm laser is formed.

Furthermore, the MQW active layer 101 is formed in a multilayer structure which consists of an n-$(Al_{0.5}Ga_{0.5})_{0.5}In_{0.5}P$ guide layer of 50 nm thick, a multi quantum well structure, and a p-$(Al_{0.5}Ga_{0.5})_{0.5}In_{0.5}P$ guide layer of 50 nm thick, the multi quantum well structure being constituted of four $Ga_{0.5}In_{0.5}P$ wells of 8 nm thickness and three $(Al_{0.5}Ga_{0.5})_{0.5}In_{0.5}$ barriers of 4 nm thickness.

Subsequently, a stripe-shaped opening section is formed in the current block layer as a current injection section. A stripe-shaped mask of about 5 $\mu$m wide is opened by a photolithography technique in forming the opening section. Then, the n-GaAs block layer 108 and the n-AlGaInP block layer 107 are sequentially removed by selective etching. Phosphoric acid group etchant was used for etching the GaAs block layer 108 and halogen group etchant was used for etching the AlGaInP block layer 107.

Thereafter, a p-$Al_{0.6}Ga_{0.4}As$ clad layer 105 and a p-GaAs contact layer 109 was sequentially formed by the second MOVPE growth process. Finally, after the n-GaAs subs t rate 101 was polished to about 100 $\mu$m, a p-side electrode 112 and an n-side electrode 111 were formed. Through formation of a resonator surface by cleavage and an element separation, the laser structure was completed.

In the above-described manufacturing processes, careful consideration for the relation of the refractive indexes between AlGaInP and AlGaAs, each belonging to different material group, is particularly important in designing the laser of the present invention. The compositions of the p-AlGaIP clad layer 103 and the p-AlGaAs clad layer 105 were designed so that refractive indexes of the layers agree approximately. In addition, aluminium composition in the n-AlGaInP block layer 107 was made slightly higher so that its refractive index is slightly smaller than those of the clad layers 103 and 105 to form a refractive index waveguide structure.

Thus, an equivalent refractive index difference can be about $3 \times 10^{-3}$ with respect is the waveguide in a horizontal direction.

As described above, the feature of the present invention is the usage of the AlGaAs as an additional clad layer to bury the stripe-shaped opening section for current injection. Thus, in this embodiment, crystal distortion due to lattice discrepancy and deterioration in crystalinity such as an impurity solid phase diffusion never occur so that an excellent laser oscillation characteristic can be obtained.

Furthermore, in this embodiment, the problem of deterioration in crystalinity due to surface oxidation in burying the AlGaAs clad layer 105 can be avoided by constituting the current block layer from a two layer structure formed of the n-AlGaInP block layer 107 and the n-GaAs block layer 108. It is noted that dispersed oscillation light in the vertical direction does not reach the n-GaAs block layer 108 and absorption loss scarcely occurs.

When the semiconductor laser manufactured according to the above-described method was evaluated, it was confirmed that the threshold current is greatly reduced compared to the conventional laser having the n-GaAs block layer, and light output efficiency is improved. In addition, as there is no crystal distortion, it has good characteristics in practical use. It was confirmed that the 670 nm laser possesses an excellent characteristic in having an threshold current less than 10 mA, and it was also confirmed that the 650 nm laser possesses an excellent characteristic in having an threshold current equal to approximately 20 mA. Furthermore, both lasers had estimated lives of more than 2000 hours.

Next, the self-pulsation semiconductor laser of the present invention shown in FIG. 5 will be -described. A manufacturing method of the semiconductor laser shown in FIG. 5 is almost the same as that shown in FIG. 4. An over-etching is performed when the n-AlGaInP block layer 207 is selectively etched, so that the side etched shape as shown in FIG. 5 is manufactured. Etchant is the halogen group, similar to the one above. Using this etchant it is possible to have an etching selection rate between AlGaInP and GaInP sufficient to form the shape illustrated.

When evaluation of the manufactured semiconductor laser (wavelength 650 nm) was made, a clear self-pulsation was observed, in addition to a good static characteristic. Furthermore, when this semiconductor laser was fabricated for an optical head for an optical disk to perform a feedbacked light noise evaluation, a low noise characteristic less than −130 dB/Hz up to a feedbacked light of 3% could be obtained, and it was confirmed that it has a sufficient characteristic for use in the optical disk.

As described above, according to the semiconductor laser of the present invention, the transparent waveguide path AlGaInP semiconductor laser can be easily realized without bringing about deterioration in characteristic due to introduction of a crystal distortion, and which produces less internal loss and has a low threshold current and a high light output efficiency.

Furthermore, the self-pulsation semiconductor laser having a saturation absorption region can be realized, simply and easily.

While preferred embodiments of the present invention have been described using specific terms, such description is for illustrative purposes only, and it is to be understood that changes and variations may be made without deviating from the spirit or scope of the following claims.

What is claimed is:

1. A semiconductor laser comprising:

an active layer formed on a GaAs substrate, upper and lower clad layers containing said active layer therebetween, said upper clad layer formed of a semiconductor containing AlGaInP and AlInP, an etching stopper layer which does not contain aluminum formed on said upper clad layer, a current block layer which transmits oscillation light, located above said etching stopper layer and having a stripe-shaped opening section exposing an upper surface of said etching stopper layer, and an additional clad layer of AlGaAs formed on said current block layer and on said etching stopper layer through said stripe-shaped opening section of said current block layer.

2. The semiconductor laser according to claim 1, wherein said current block layer contains at least one layer of GaAs and one layer of AlGaInP or AlInP.

3. A semiconductor laser according to claim 2, wherein a first layer of said at least two layers is located above and in contact with said etching stopper layer and a second layer of said at least two layers is located above said first layer and wherein said stripe-shaped opening of said current block layer has a first width in the horizontal direction at said first layer and a second width in the horizontal direction at said second layer, said first width being greater than said second width.

4. The semiconductor laser according to claim 1, wherein said etching stopper layer contains GaInP.

* * * * *

UNITED STATES PATENT AND TRADEMARK OFFICE
CERTIFICATE OF CORRECTION

PATENT NO. : 5,822,348
DATED : October 13, 1998
INVENTOR(S) : Kiroaki Fujii

It is certified that error appears in the above-identified patent and that said Letters Patent is hereby corrected as shown below:

On the title page, under item [56], insert the following:

FOREIGN PATENT OR PUBLISHED FOREIGN PATENT APPLICATION

| | | DOCUMENT NUMBER | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|
| | | 6 | 2 | 3 | 9 | 0 | 8 | 8 | 2/87 | Japan | | | | |
| | | 6 | 2 | 8 | 6 | 7 | 8 | 3 | 4/87 | Japan | | | | |
| | | 3 | 1 | 2 | 7 | 8 | 9 | 1 | 5/91 | Japan | | | | |
| | | 4 | 2 | 5 | 1 | 9 | 2 | | 1/92 | Japan | | | | |
| | | 4 | 1 | 3 | 3 | 3 | 8 | 1 | 5/92 | Japan | | | | |
| | | 4 | 3 | 1 | 2 | 9 | 9 | 1 | 11/92 | Japan | | | | |
| | | 5 | 2 | 1 | 9 | 0 | 7 | | 1/93 | Japan | | | | |
| | | 5 | 2 | 9 | 7 | 0 | 0 | | 2/93 | Japan | | | | |
| | | 7 | 1 | 3 | 1 | 1 | 0 | 7 | 5/95 | Japan | | | | |
| | | | | | | | | | | | | | | |

Signed and Sealed this

Thirtieth Day of March, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT NO. : 5,822,348
DATED : October 13, 1998
INVENTOR(S) : Hiroaki FUJII

It is certified that error appears in the above-identified patent and that said Letters Patent is hereby corrected as shown below:

Column 2, Line 10 delete "well known a" and insert --a well known--

Column 5, Line 58 delete "5" and insert --50--

Signed and Sealed this

Sixth Day of July, 1999

Attest:

Q. TODD DICKINSON

Attesting Officer

Acting Commissioner of Patents and Trademarks